(12) United States Patent
Li et al.

(10) Patent No.: US 11,974,460 B2
(45) Date of Patent: Apr. 30, 2024

(54) DISPLAY SUBSTRATE AND METHOD OF MANUFACTURING THE SAME, AND DISPLAY DEVICE

(71) Applicant: BOE TECHNOLOGY GROUP CO., LTD., Beijing (CN)

(72) Inventors: Yangbing Li, Beijing (CN); Haisheng Wang, Beijing (CN); Xiaoliang Ding, Beijing (CN); Yunke Qin, Beijing (CN); Fangyuan Zhao, Beijing (CN); Wenjuan Wang, Beijing (CN); Ping Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 457 days.

(21) Appl. No.: 17/437,296

(22) PCT Filed: Dec. 28, 2020

(86) PCT No.: PCT/CN2020/140268
§ 371 (c)(1),
(2) Date: Sep. 8, 2021

(87) PCT Pub. No.: WO2021/164423
PCT Pub. Date: Aug. 26, 2021

(65) Prior Publication Data
US 2022/0181590 A1    Jun. 9, 2022

(30) Foreign Application Priority Data

Feb. 21, 2020   (CN) .......................... 202010108928.7

(51) Int. Cl.
*H10K 50/86*    (2023.01)
*H10K 59/131*   (2023.01)
(Continued)

(52) U.S. Cl.
CPC ......... *H10K 50/865* (2023.02); *H10K 59/131* (2023.02); *H10K 59/50* (2023.02); *H10K 71/00* (2023.02)

(58) Field of Classification Search
CPC ........ H10K 59/00; H10K 59/10; H10K 59/12; H10K 59/121; H10K 59/126; H10K 59/131; H10K 59/50; H10K 71/00; H10K 50/865
See application file for complete search history.

(56) References Cited

U.S. PATENT DOCUMENTS

2005/0008770 A1 * 1/2005 Kawase ................. G02B 5/201
                                                      427/162
2016/0247832 A1 * 8/2016 Suzawa ............... H01L 29/7869

FOREIGN PATENT DOCUMENTS

CN   101840679 A    9/2010
CN   107301407 A   10/2017
(Continued)

OTHER PUBLICATIONS

Second Office Action for the Chinese Patent Application No. 202010108928.7 issued by the Chinese Patent Office dated Nov. 8, 2022.

*Primary Examiner* — Brook Kebede
(74) *Attorney, Agent, or Firm* — IP&T GROUP LLP

(57) ABSTRACT

A display substrate includes a plurality of sub-pixels. The display substrate further includes: a base substrate; a plurality of temperature sensors disposed on a first side of the base substrate; and a light-shielding layer disposed on a peripheral side, a side proximate to the base substrate, and a side away from the base substrate, of a temperature sensor in the temperature sensors. The temperature sensor is configured to detect a temperature of at least one of the plurality (Continued)

of sub-pixels. The light-shielding layer is configured to shield light emitted to the temperature sensor.

20 Claims, 12 Drawing Sheets

(51) Int. Cl.
*H10K 59/50* (2023.01)
*H10K 71/00* (2023.01)

(56) References Cited

FOREIGN PATENT DOCUMENTS

| | | |
|---|---|---|
| CN | 110289297 A | 9/2019 |
| CN | 111312767 A | 6/2020 |
| KR | 10-2009-0070254 A | 7/2009 |

* cited by examiner

1

DISPLAY SUBSTRATE AND METHOD OF MANUFACTURING THE SAME, AND DISPLAY DEVICE

CROSS-REFERENCE TO RELATED APPLICATIONS

This application is a national phase entry under 35 USC 371 of International Patent Application No. PCT/CN 2020/140268, filed on Dec. 28, 2020, which claims priority to Chinese Patent Application No. 202010108928.7, filed on Feb. 21, 2020, which are incorporated herein by reference in their entirety.

TECHNICAL FIELD

The present disclosure relates to the field of display technologies, and in particular, to a display substrate and a method of manufacturing the same, and a display device.

BACKGROUND

Organic light-emitting diodes (OLEDs) have been widely used in the display field due to their advantages of high brightness, full angle of view, fast response speed, and flexible display, etc.

SUMMARY

In an aspect, a display substrate is provided, including a plurality of sub-pixels. The display substrate further includes: a base substrate; a plurality of temperature sensors disposed on a first side of the base substrate; and a light-shielding layer disposed on a peripheral side, a side proximate to the base substrate, and a side away from the base substrate, of a temperature sensor in the temperature sensors. The temperature sensor is configured to detect a temperature of at least one of the plurality of sub-pixels. The light-shielding layer is configured to shield light emitted to the temperature sensor.

In some embodiments, the light-shielding layer includes a first peripheral light-shielding layer covering the peripheral side of the temperature sensor. An orthographic projection of the first peripheral light-shielding layer on the base substrate is a closed figure around the temperature sensor.

In some embodiments, an inner edge of the first peripheral light-shielding layer extends to the side of the temperature sensor away from the base substrate, and an outer edge of the first peripheral light-shielding layer extends to a peripheral area of the temperature sensor.

In some embodiments, a material of the first peripheral light-shielding layer includes a light-shielding ink or a light-shielding organic material.

In some embodiments, the display substrate further includes an insulating layer disposed on the side of the temperature sensor away from the base substrate. A groove around the peripheral side of the temperature sensor is provided in the insulating layer. The light-shielding layer includes a second peripheral light-shielding layer disposed in the groove. The second peripheral light-shielding layer at least covers an inner sidewall of the groove proximate to the temperature sensor.

In some embodiments, the second peripheral light-shielding layer is a light-shielding film at least covering the inner sidewall of the groove proximate to the temperature sensor, or a loop-shaped retaining wall filled in the groove.

In some embodiments, a material of the second peripheral light-shielding layer includes a light-shielding ink, a light-shielding organic material, or a light-shielding metal material.

In some embodiments, the light-shielding layer includes a first light-shielding electrode disposed on the side of the temperature sensor proximate to the base substrate. An orthographic projection of the temperature sensor on the base substrate is within a range of an orthographic projection of the first light-shielding electrode on the base substrate.

In some embodiments, the display substrate further includes a temperature control transistor disposed on the side of the temperature sensor proximate to the base substrate. The temperature control transistor includes a source and a drain, the source, the drain, and the first light-shielding electrode are arranged in a same layer, and the source or the drain is electrically connected to the first light-shielding electrode.

In some embodiments, the light-shielding layer includes a second light-shielding electrode disposed on the side of the temperature sensor away from the base substrate. An orthographic projection of the temperature sensor on the base substrate is within a range of an orthographic projection of the second light-shielding electrode on the base substrate.

In some embodiments, the display substrate further includes a bias voltage signal line electrically connected to at least one of the plurality of temperature sensors. The second light-shielding electrode and the bias voltage signal line are arranged in a same layer, and are electrically connected to each other.

In some embodiments, the display substrate further includes an insulating layer disposed on the side of the temperature sensor away from the base substrate, and a groove around the peripheral side of the temperature sensor is provided in the insulating layer. In a case where the light-shielding layer includes a second peripheral light-shielding layer disposed in the groove, the second peripheral light-shielding layer at least covers an inner sidewall of the groove proximate to the temperature sensor, and a material of the second peripheral light-shielding layer includes a light-shielding metal material, the second peripheral light-shielding layer and the second light-shielding electrode are arranged in a same layer.

In some embodiments, the display substrate has a plurality of pixel areas, and at least one of the plurality of sub-pixels is disposed in a pixel area in the pixel areas. The display substrate further includes a plurality of photosensitive sensors disposed on the first side of the base substrate. At least one of the plurality of photosensitive sensors is disposed in the pixel area. The at least one photosensitive sensor is configured to detect at least one luminous intensity of the at least one sub-pixel in the pixel area where the at least one photosensitive sensor is located.

In some embodiments, the display substrate further includes a first signal line electrically connected to the photosensitive sensor, and a second signal line electrically connected to the temperature sensor. Or, the display substrate further includes the first signal line electrically connected to the photosensitive sensor, and the temperature sensor is electrically connected to the first signal line that is electrically connected to any photosensitive sensor located in a same pixel area.

In another aspect, a method of manufacturing a display substrate is provided. The method of manufacturing the display substrate includes: providing a base substrate; manufacturing a plurality of temperature sensors on a first side of the base substrate; forming a light-shielding layer on a peripheral side, a side proximate to the base substrate, and a side away from the base substrate, of a temperature sensor in the temperature sensors. The light-shielding layer being configured to shield light emitted to the temperature sensor.

In some embodiments, the light-shielding layer includes a first peripheral light-shielding layer. Forming the first peripheral light-shielding layer on the peripheral side of the temperature sensor, includes: forming a first light-shielding film on the base substrate on which the plurality of temperature sensors are formed; patterning the first light-shielding film to form the first peripheral light-shielding layer. The first peripheral light-shielding layer covers the peripheral side of the temperature sensor, and an orthographic projection of the first peripheral light-shielding layer on the base substrate being a closed figure around the temperature sensor.

In some embodiments, the light-shielding layer includes a second peripheral light-shielding layer. Forming the second peripheral light-shielding layer on the peripheral side of the temperature sensor, includes: forming an insulating film on the side of the temperature sensor away from the base substrate; patterning the insulating film to form a groove in the insulating film; forming the second peripheral light-shielding layer in the groove. The groove is around the peripheral side of the temperature sensor, and the second peripheral light-shielding layer at least covers an inner sidewall of the groove proximate to the temperature sensor.

In some embodiments, forming the second peripheral light-shielding layer in the groove, includes: forming a second light-shielding film on a side of the insulating film with the groove away from the base substrate; patterning the second light-shielding film to form the second peripheral light-shielding layer.

In some embodiments, forming the second peripheral light-shielding layer in the groove, includes: filling a material of the second peripheral light-shielding layer in the groove by using a printing process to form a loop-shaped retaining wall in the groove.

In yet another aspect, a display device is provided. The display device includes the display substrate according to some of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, and an actual process of a method involved in the embodiments of the present disclosure.

DETAILED DESCRIPTION

Figure 1:
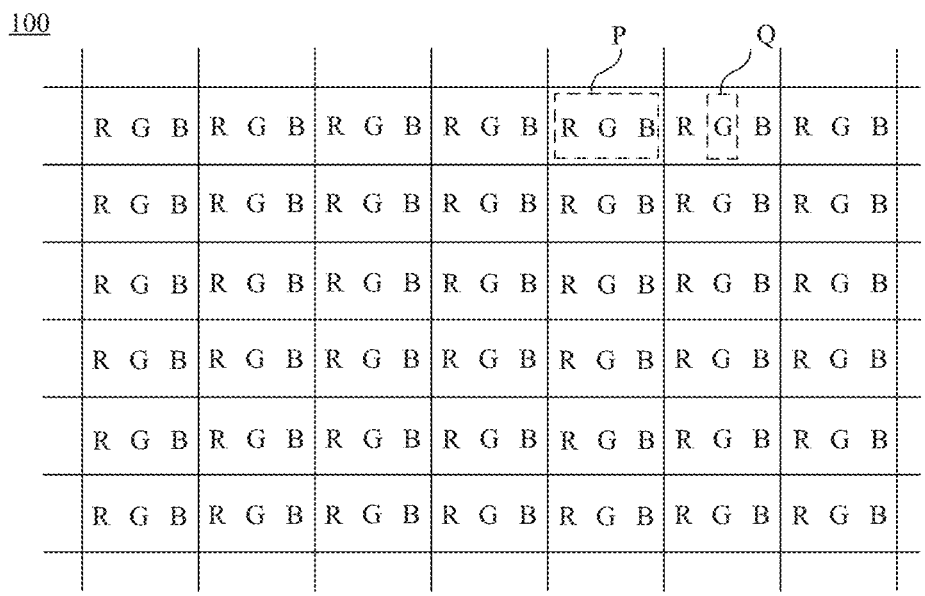
FIG. 1 is a structural diagram of a display substrate, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Below, the terms "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its extensions may be used. For example, the term "connected" may be used in the description of some embodiments to indicate that two or more components are in direct physical contact or electrical contact with each other. The embodiments disclosed herein are not necessarily limited to the contents herein.

In the related art, after an OLED display device is manufactured, a luminance of each sub-pixel is usually corrected, so that each sub-pixel is able to emit light with an ideal luminance. However, after the OLED display device operates for a period of time, the luminance of each sub-pixel in the OLED display device may decline, which may cause the OLED display device to have an uneven luminance and a residual image during display, thereby affecting display effects of the OLED.

Thus, an optical compensation technique is provided. A Photosensitive sensor is provided in the OLED display device, so as to use the photosensitive sensor to detect the luminance of the sub-pixel in the OLED display device. In this way, an electric signal of a driving circuit of the sub-pixel may be adjusted according to a difference between the luminance detected by the photosensitive sensor and the ideal luminance, so as to compensate the luminance of the sub-pixel.

However, the photosensitive sensor is affected by temperature(s) of at least one sub-pixel, which results in a deviation of a detection result, and thus affects a compensation accuracy of the luminance of the at least one sub-pixel, thereby affecting the display effects of the OLED display device.

Thus, a technique for providing a plurality of temperature sensors in the OLED display device is provided. The temperature sensor is used to detect the temperature of the sub-pixel in the OLED display device, and the result detected by the photosensitive sensor is corrected according to a result detected by the temperature sensor, so as to improve the compensation accuracy of the luminance of the sub-pixel.

However, characteristics of the temperature sensor under illumination are liable to change, which affects an accuracy of the temperature of the sub-pixel detected by the temperature sensor, and thus affects a correction accuracy of the result detected by the photosensitive sensor, thereby reducing the compensation accuracy of the luminance of the sub-pixel.

Based on this, in some embodiments of the present disclosure, a display substrate 100 is provided. As shown in FIG. 1, the display substrate 100 has a plurality of pixel areas P. The display substrate 100 includes a plurality of sub-pixels Q. Each sub-pixel Q may emit light of one color, for example, one of white, red, green, and blue. Of course, each sub-pixel Q may also emit light of another color, which may be selected and set according to actual needs here.

Each pixel area P is provided with at least one of the plurality of sub-pixels Q. That is, each pixel area P may be provided with one sub-pixel Q, or each pixel area P may be provided with a plurality of sub-pixels Q.

The number of sub-pixel(s) Q disposed in each pixel area P may be selected and set according to actual needs. For example, each pixel area P is provided with one sub-pixel Q, and the sub-pixel Q may emit white light, red light, green light, or blue light. For another example, as shown in FIG. 1, each pixel area P is provided with three sub-pixels Q, and the three sub-pixels Q may emit red light, green light, and blue light, respectively. For yet another example, each pixel area P is provided with four sub-pixels Q, and the four sub-pixels Q may emit white light, red light, green light and blue light, respectively. Or, two of the four sub-pixels Q may emit green light, and the other two sub-pixels Q may emit red light and blue light, respectively.

In some examples, as shown in FIGS. 4 to 7, each sub-pixel Q includes a light-emitting device F and a driving transistor D configured to drive the light-emitting device F to emit light. Here, the light-emitting device F has various structures. For example, the light-emitting device F may include a cathode F1, a light-emitting layer F2, a color filter layer F3, and an anode F4 that are sequentially stacked, and the color filter layer F3 is a red color filter layer, a green color filter layer, or a blue color filter layer. For example, the light-emitting device F may include a cathode F1, a light-emitting layer F2, and an anode F4 that are sequentially stacked, and the light-emitting layer F2 itself may emit colored light.

In addition, as shown in FIGS. 2 to 7, the display substrate 100 further includes a base substrate 1, and both a plurality of photosensitive sensors 2 and a plurality of temperature sensors 3 disposed on a first side A of the base substrate 1.

The base substrate 1 includes many types, which may be selected and set according to actual needs. For example, the base substrate 1 includes a rigid base substrate such as a glass base substrate. For example, the base substrate 1 includes a flexible base substrate such as a polyethylene terephthalate (PET) base substrate, a polyethylene naphthalate two formic acid glycol ester (PEN) base substrate, or a polyimide (PI) base substrate.

The base substrate 1 has two surfaces opposite to each other. The two surfaces are two sides of the base substrate 1, and the first side A on which the plurality of photosensitive sensors 2 and the plurality of temperature sensors 3 are provided refers to one of the two sides.

In some examples, a relationship between the plurality of photosensitive sensors 2 and the pixel areas P is that: each pixel area P is provided with at least one of the plurality of photosensitive sensors 2. That is, each pixel area P may be provided with one photosensitive sensor 2, or each pixel area P may be provided with a plurality of photosensitive sensors 2.

The at least one photosensitive sensor 2 is configured to detect a luminous intensity of the sub-pixel(s) Q in the pixel area P where the at least one photosensitive sensor 2 is located. That is, a light signal is converted into an electrical signal, and a magnitude of the electrical signal indicates a magnitude of the luminous intensity. Here, the at least one photosensitive sensor 2 detecting the luminous intensity of the sub-pixel(s) Q in the pixel area P where the at least one photosensitive sensor 2 is located includes various examples. Several examples among them are schematically described below.

Figure 2:
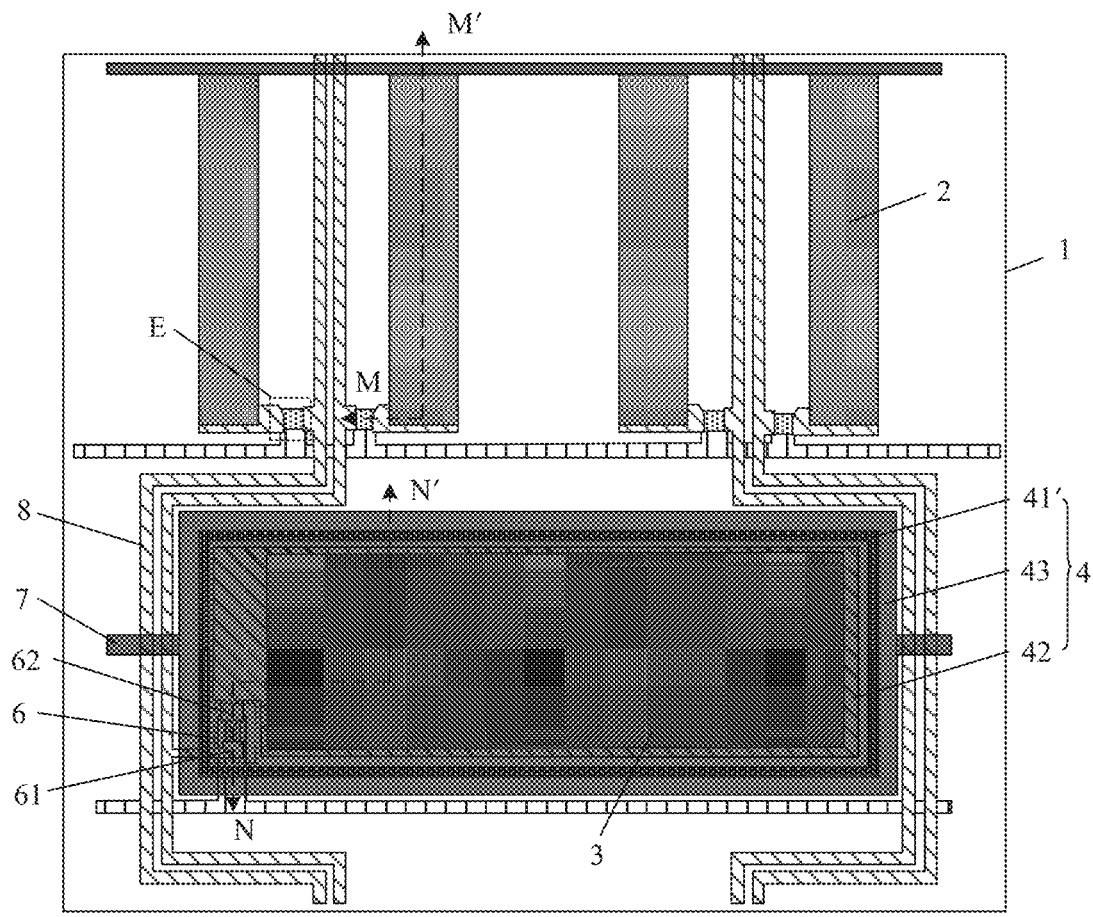
FIG. 2 is a structural diagram in a pixel area, in accordance with some embodiments of the present disclosure.
Figure 3:
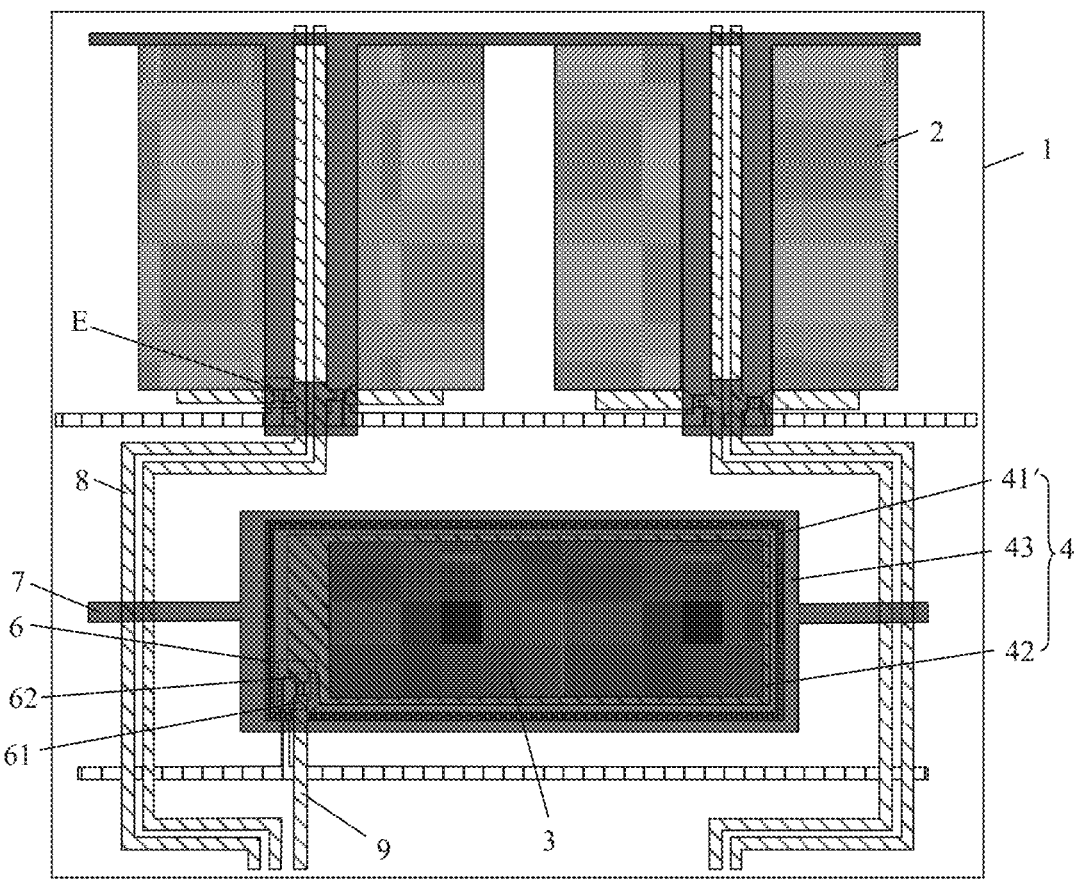
FIG. 3 is another structural diagram in a pixel area, in accordance with some embodiments of the present disclosure.

For example, each pixel area P is provided with one photosensitive sensor 2, and each pixel area P is provided with one sub-pixel Q. Or, as shown in FIGS. 2 and 3, each pixel area P is provided with a plurality of photosensitive sensors 2, and each pixel area P is provided with sub-pixels Q having the same number as the plurality of photosensitive sensors 2. In this case, each photosensitive sensor 2 detects the luminous intensity of one sub-pixel Q, which is beneficial to improve an accuracy of a detection result of each photosensitive sensor 2.

For example, each pixel area P is provided with one photosensitive sensor 2, and each pixel area P is provided with a plurality of sub-pixel Q. Or, each pixel area P is provided with a plurality of photosensitive sensors 2, and each pixel area P is provided with sub-pixels Q having a larger number than the plurality of photosensitive sensors 2. In this case, each photosensitive sensor 2 detects a luminous intensity of a plurality of sub-pixels Q, which may reduce the number of photosensitive sensors 2 disposed in the display substrate 100, and reduce an occupancy rate of the photosensitive sensors 2 in the display substrate 100.

By providing the photosensitive sensor 2, after the photosensitive sensor 2 detects the luminous intensity of the sub-pixel Q, the detection result may be compared with a corrected result of the sub-pixel Q. In a case where the detection result and the corrected result have a difference therebetween, the sub-pixel Q is compensated, so that the sub-pixel Q emits light with a luminance corresponding to the ideal luminance.

In some examples, the photosensitive sensor 2 has various structures. For example, as shown in FIGS. 4 to 7, the photosensitive sensor 2 includes a first semiconductor layer 21 disposed on the first side A of the base substrate 1, and a first protection electrode 22 covering a side surface of the first semiconductor layer 21 away from the base substrate 1.

The first semiconductor layer 21 is able to detect the luminous intensity of the sub-pixel Q. The first protection electrode 22 is able to protect the side surface of the first semiconductor layer 21 away from the base substrate 1, so as to prevent the side surface of the first semiconductor layer 21 away from the base substrate 1 from being damaged, thereby avoiding an influence on an accuracy of the detected luminous intensity due to an influence on a detection performance of the first semiconductor layer 21.

In some examples, the first protection electrode 22 is made of a transparent conductive material. For example, the first protection electrode 22 is made of indium tin oxide (ITO) or indium-doped zinc oxide (IZO), which may avoid an influence of the first semiconductor layer 21 on the detection of the luminous intensity of the sub-pixel Q due to shielding of light by the first protection electrode 22.

In some embodiments, the temperature sensor 3 is configured to detect a temperature of at least one of the plurality of sub-pixels Q. That is, a temperature signal is converted into an electrical signal, and a magnitude of the electrical signal indicates a magnitude of the temperature. That is, each temperature sensor 3 may detect a temperature of one sub-pixel Q, or each temperature sensor 3 may detect a temperature of a plurality of sub-pixels Q. Here, the plurality of sub-pixels Q may be some or all of sub-pixels Q belonging to the same pixel area P. The plurality of sub-pixels Q may also be all of sub-pixels Q belonging to different pixel areas P, or may be all of sub-pixels Q belonging to one of different pixel areas P and some of sub-pixels Q belonging to another pixel area(s) P, or may be some of sub-pixels Q belonging to respective pixel areas P.

In a case where each temperature sensor 3 is able to detect the temperature of the plurality of sub-pixels Q, the plurality of sub-pixels Q are, for example, two adjacent sub-pixels Q, or, for example, three adjacent sub-pixels Q arranged in a shape of a Chinese character "—", or, for example, three adjacent sub-pixels Q arranged in a shape of a Chinese character "吅" or an "L", or, for example, four adjacent sub-pixels Q arranged in a shape of a Chinese character "田". Since the temperature of the sub-pixel Q changes slowly, temperature differences between adjacent sub-pixels Q may be negligible. In this way, the temperature detected by the temperature sensor 3 may be regarded as the temperature of each of the plurality of sub-pixels Q.

By providing each temperature sensor 3 to detect the temperature of one sub-pixel Q, an accuracy of a detection result may be improved. By providing each temperature sensor 3 to detect the temperature of the plurality of sub-pixels Q, the number of temperature sensors 3 disposed in the display substrate 100 may be reduced, and thus an occupancy rate of the temperature sensors 3 in the display substrate 100 may be reduced.

From the relationship between the temperature sensors 3 and the sub-pixels Q, as well as the relationship between the photosensitive sensors 2 and the sub-pixels Q and the relationship between the photosensitive sensors 2 and the pixel areas P, it can be seen that in each pixel area P, as shown in FIGS. 2 and 3, one temperature sensor 3 may detect the temperature of one sub-pixel Q corresponding to one photosensitive sensor 2, or one temperature sensor 3 may detect the temperature of the plurality of sub-pixels Q corresponding to one photosensitive sensor 2. Or, one temperature sensor 3 may detect the temperature of sub-pixels Q in the plurality of pixel areas P. In this way, when the sub-pixels Q are optically compensated, at least one sub-pixel Q corresponding to the temperature sensor 3 may be simultaneously optically compensated according to the detection result of the temperature sensor 3.

In some examples, the temperature sensor 3 has various structures. For example, as shown in FIGS. 4 to 7, the temperature sensor 3 has a similar structure to the photosensitive sensor 2. That is, the temperature sensor 3 includes a second semiconductor layer 31 disposed on the first side A of the base substrate 1, and a second protection electrode 32 covering a side surface of the second semiconductor layer 31 away from the base substrate 1.

The second semiconductor layer 31 is able to detect the temperature of the sub-pixel Q. The second protection electrode 32 is able to protect the side surface of the second semiconductor layer 31 away from the base substrate 1, so as to prevent the side surface of the second semiconductor layer 31 away from the base substrate 1 from being damaged, thereby avoiding an influence on a detection performance of the second semiconductor layer 31.

In some examples, the second protection electrode 32 is made of a transparent conductive material. For example, the second protection electrode 32 is made of ITO or IZO.

In some embodiments, as shown in FIGS. 4 to 7, the display substrate 100 further includes a light-shielding layer 4 disposed on a peripheral side B, a side proximate to the base substrate 1, and a side away from the base substrate, of the temperature sensor 3. The light-shielding layer 4 is configured to shield light emitted to the temperature sensor 3.

The light-shielding layer 4 is disposed on the peripheral side B, the side proximate to the base substrate 1, and the side away from the base substrate, of the temperature sensor 3, which may wrap the temperature sensor 3. In this way, when light emitted from the sub-pixels Q or ambient light is emitted to a position where the temperature sensor 3 is located, the light-shielding layer 4 may shield the light, so as to prevent the light from being incident on the temperature sensor 3.

Figure 8:
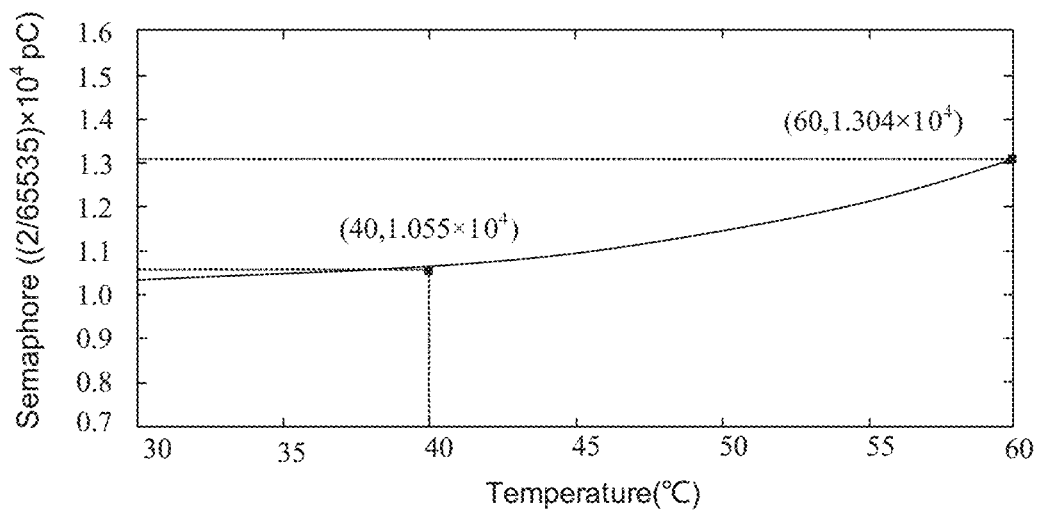
FIG. 8 is a data graph of a semaphore of a temperature sensor varying with temperature in a dark state, in accordance with some embodiments of the present disclosure.
Figure 9:
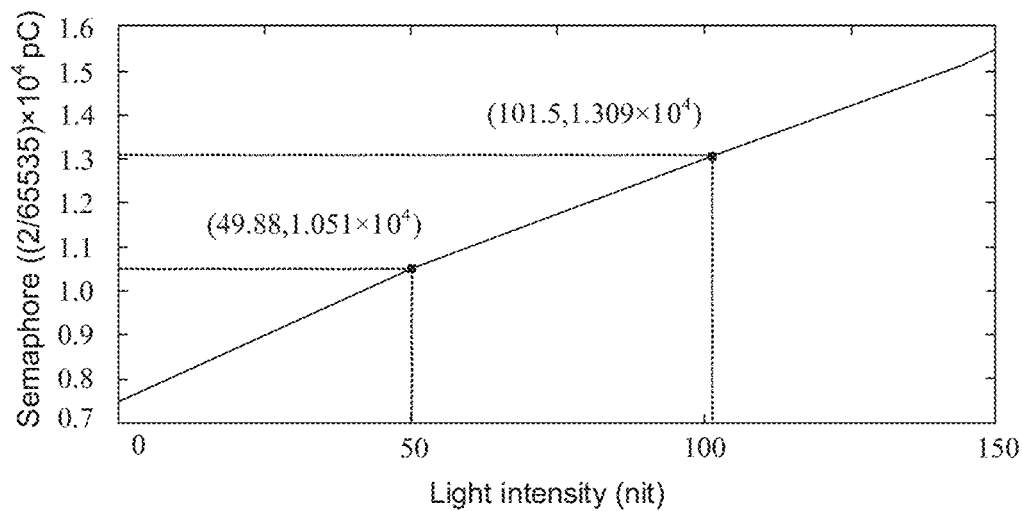
FIG. 9 is a data graph of a semaphore of a temperature sensor varying with light intensity at an ambient temperature (26° C.), in accordance with some embodiments of the present disclosure.

In some examples, FIG. 8 is a data graph of a semaphore of the temperature sensor 3 varying with temperature in a dark state, and FIG. 9 is a data graph of the semaphore of the temperature sensor 3 varying with light intensity at an ambient temperature (26° C.). It can be seen from the meanings expressed in FIGS. 8 and 9 that the temperature sensor 3 has a great response to light, and the temperature sensor 3 is more affected by light intensity than temperature.

Figure 10:
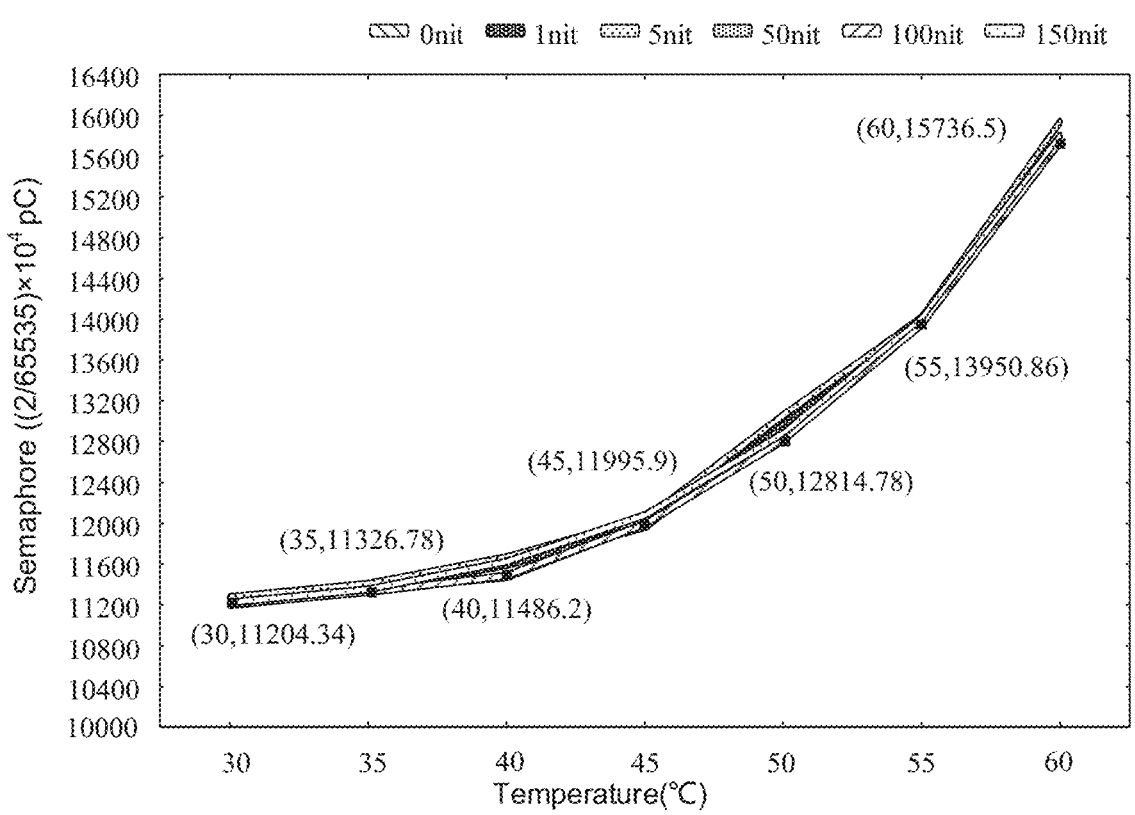
FIG. 10 is a data graph of a semaphore of a temperature sensor provided with a light-shielding layer varying with temperature and light intensity, in accordance with some embodiments of the present disclosure.

FIG. 10 is a data graph of the semaphore of the temperature sensor 3 provided with the light-shielding layer 4 varying with temperature and light intensity. It can be seen from the meaning expressed in FIG. 10 that curves of the semaphore of the temperature sensor 3 varying with temperature at different light intensities are substantially consistent. That is, after the light-shielding layer 4 is provided, the semaphore of the temperature sensor 3 is substantially not affected by light intensity, but only varies with temperature. It can be seen from this that a use performance of the temperature sensor 3 may be greatly improved.

Figure 11:
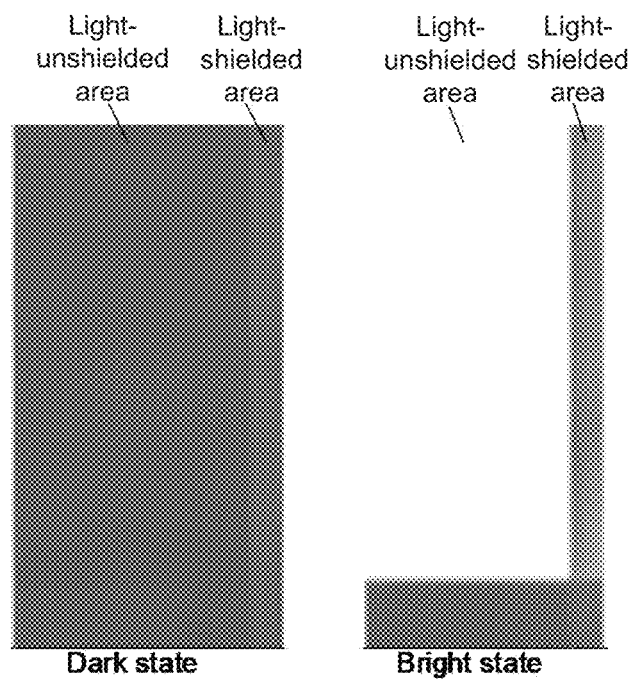
FIG. 11 is a photosensitivity comparison diagram of a temperature sensor in dark and bright states, in accordance with some embodiments of the present disclosure.
Figure 12:
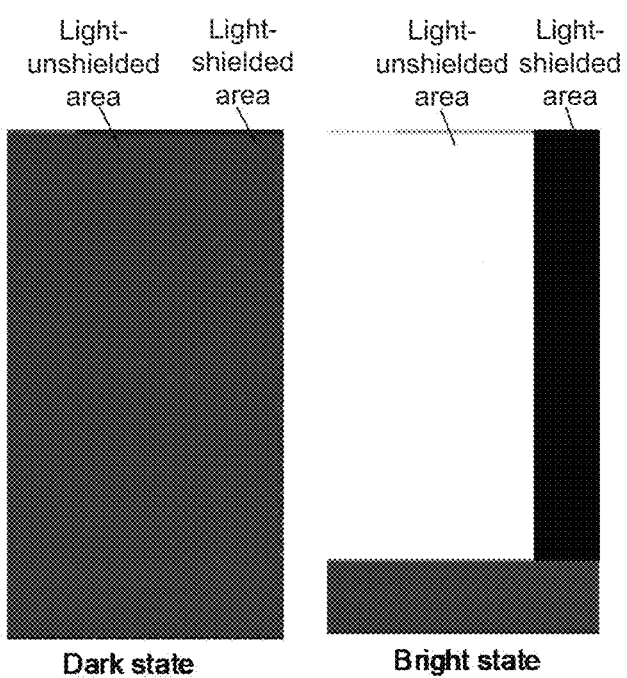
FIG. 12 is a photosensitivity comparison diagram of a temperature sensor provided with a light-shielding layer in dark and bright states, in accordance with some embodiments of the present disclosure.

In addition, FIG. 11 is a photosensitivity comparison diagram of the temperature sensor 3 in dark and bright states, and FIG. 12 is a photosensitivity comparison diagram of the temperature sensor 3 provided with the light-shielding layer 4 in dark and bright states. It can be seen from the meanings expressed in FIGS. 11 and 12 that after the light-shielding layer 4 is provided, in a case of performing a comparison at a same gray scale, in the dark state, signals in both a light-unshielded area and a light-shielded area are close, and a gray scale of the signal in the light-shielded area is substantially unchanged in the bright state and the dark state. That is, a response of the temperature sensor in the light-shielded area to light becomes small, which means that the light-shielding layer 4 has a good light-shielding effect.

Thus, in the display substrate 100 in some embodiments of the present disclosure, by providing the temperature sensor 3, and providing the light-shielding layer 4 on the peripheral side B, the side proximate to the base substrate 1, and the side away from the base substrate, of the temperature sensor 3, the temperature sensor 3 may be completely wrapped by the light-shielding layer 4, so as to completely shield the light emitted to the temperature sensor 3, thereby avoiding an influence on characteristics of the temperature sensor 3 due to the light incident on the temperature sensor 3. In this way, the accuracy of the result detected by the temperature sensor 3 may be improved, and thus the accuracy of the corrected result may be improved in a process of correcting the result detected by the photosensitive sensor 2, thereby improving the compensation accuracy of the luminance of the sub-pixel Q.

The light-shielding layer 4 has various structures, which is not limited in the embodiments of the present disclosure, and is subject to being able to shield the light emitted to the temperature sensor 3. The structure of the light-shielding layer 4 is schematically described below.

Figure 4:
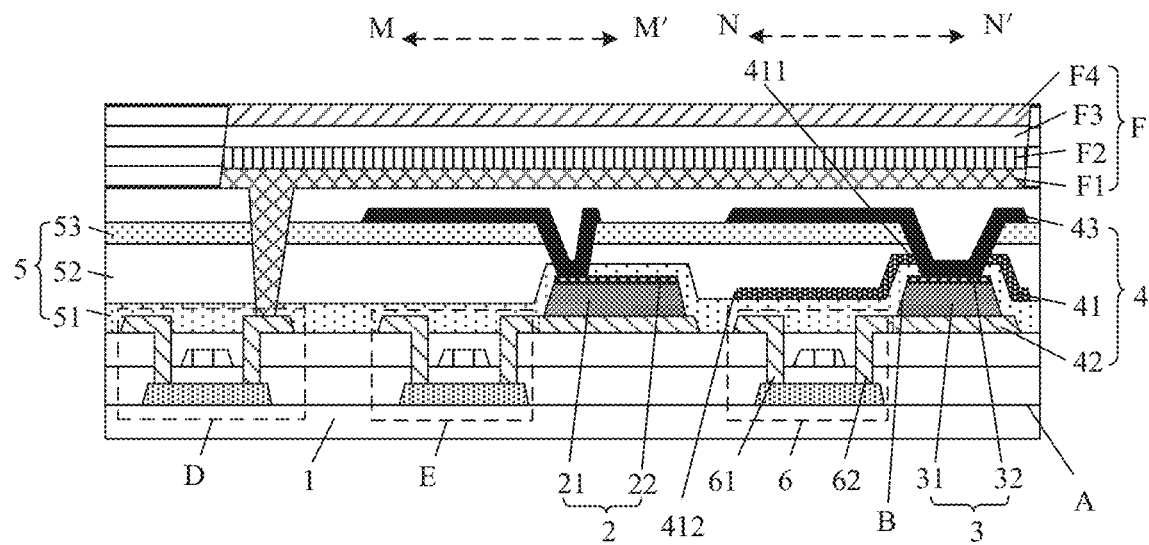
FIG. 4 is a sectional view taken along the M-M' direction and along the N-N' direction in FIG. 2.

In some embodiments, as shown in FIG. 4, the light-shielding layer 4 includes a first peripheral light-shielding layer 41 covering the peripheral side B of the temperature sensor 3. An orthographic projection of the first peripheral light-shielding layer 41 on the base substrate 1 is a closed figure around the temperature sensor 3.

The first peripheral light-shielding layer 41 covering the peripheral side B of the temperature sensor 3 means that the first peripheral light-shielding layer 41 is attached to the peripheral side B of the temperature sensor 3, and shields the peripheral side B of the temperature sensor 3. Here, the first peripheral light-shielding layer 41 being attached to the peripheral side B of the temperature sensor 3, includes: the first peripheral light-shielding layer 41 being attached to a surface of the peripheral side B of the temperature sensor 3, or, the first peripheral light-shielding layer 41 and the surface of the peripheral side B of the temperature sensor 3 being provided with other functional film(s) therebetween, such as a protection layer 51 configured to protect the temperature sensor 3 as shown in FIG. 4.

Since the surface of the peripheral side B of the temperature sensor 3 is a closed surface, the orthographic projection of the first peripheral light-shielding layer 41 covering the peripheral side B of the temperature sensor 3 on the base substrate 1 is the closed figure around the temperature sensor 3.

A shape of the closed figure is related to a shape of the temperature sensor 3. For example, the temperature sensor 3 is in a rectangular parallelepiped shape, and the closed figure is in a square ring shape. In this case, a shape of the first peripheral light-shielding layer 41 may be in a square tube shape. For another example, the temperature sensor 3 is in a cylindrical shape, and the closed figure is in an annular shape. In this case, the shape of the first peripheral light-shielding layer 41 may be in a circular tube shape.

In some examples, as shown in FIG. 4, an inner edge 411 of the first peripheral light-shielding layer 41 extends to the side of the temperature sensor 3 away from the base substrate 1, and an outer edge 412 of the first peripheral light-shielding layer 41 extends to a peripheral area of the temperature sensor 3.

Here, the inner edge 411 of the first peripheral light-shielding layer 41 refers to an edge of the first peripheral light-shielding layer 41 corresponding to an inner boundary of the orthographic projection of the first peripheral light-shielding layer 41 on the base substrate 1. The outer edge 412 of the first peripheral light-shielding layer 41 refers to an edge of the first peripheral light-shielding layer 41 corresponding to an outer boundary of the orthographic projection of the first peripheral light-shielding layer 41 on the base substrate 1. The peripheral area of the temperature sensor 3 refers to an area around an area of the base substrate 1 covered by the temperature sensor 3.

FIG. 4 is a sectional view taken along the M-M' direction and along the N-N' direction in FIG. 2. It can be seen from the figure that a section of the first peripheral light-shielding layer 41 is in a "Z" shape. In this way, a shielding area of the first peripheral light-shielding layer 41 to the peripheral side B of the temperature sensor 3 may be effectively increased, so that the first peripheral light-shielding layer 41 may completely shield the peripheral side B of the temperature sensor 3, so as to prevent the temperature sensor 3 from being irradiated by light from the peripheral side thereof, thereby avoiding the influence on the characteristics of the temperature sensor 3. Moreover, it is also beneficial to improve an adhesion between the first peripheral light-shielding layer 41 and the peripheral side B of the temperature sensor 3, so as to prevent the first peripheral light-shielding layer 41 from falling off from the peripheral side B of the temperature sensor 3.

In some examples, a material of the first peripheral light-shielding layer 41 is various. For example, the material of the first peripheral light-shielding layer 41 in the embodiments of the present disclosure includes, but is not limited to, a light-shielding ink or a light-shielding organic material (e.g., a light-shielding resin) capable of absorbing light. In this way, the first peripheral light-shielding layer 41 may be used to absorb the light emitted to the peripheral side B of the temperature sensor 3, so as to prevent the temperature sensor 3 from being irradiated by the light from the peripheral side thereof.

Figure 5:
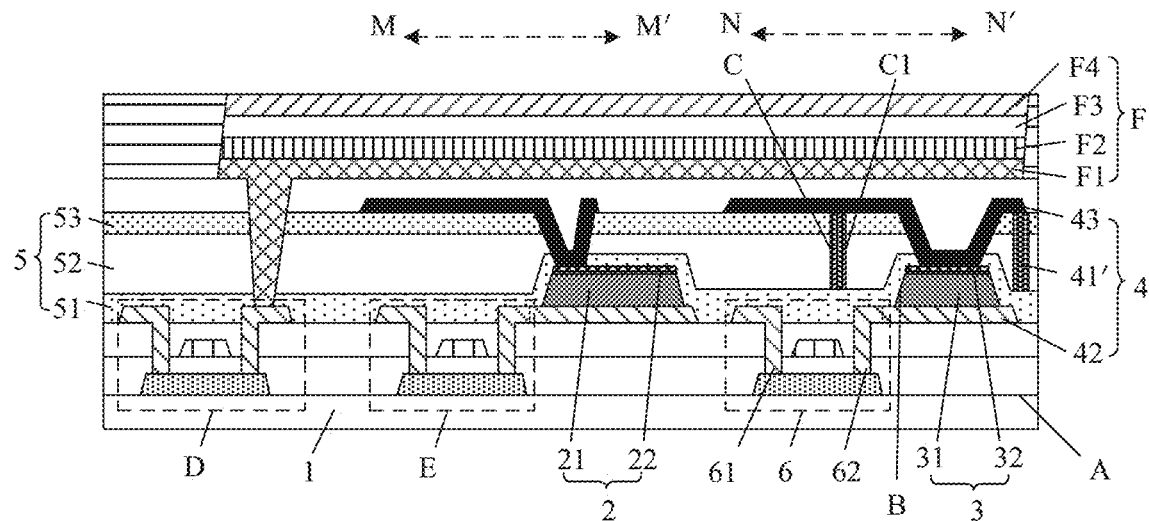
FIG. 5 is another sectional view taken along the M-M' direction and along the N-N' direction in FIG. 2.
Figure 6:
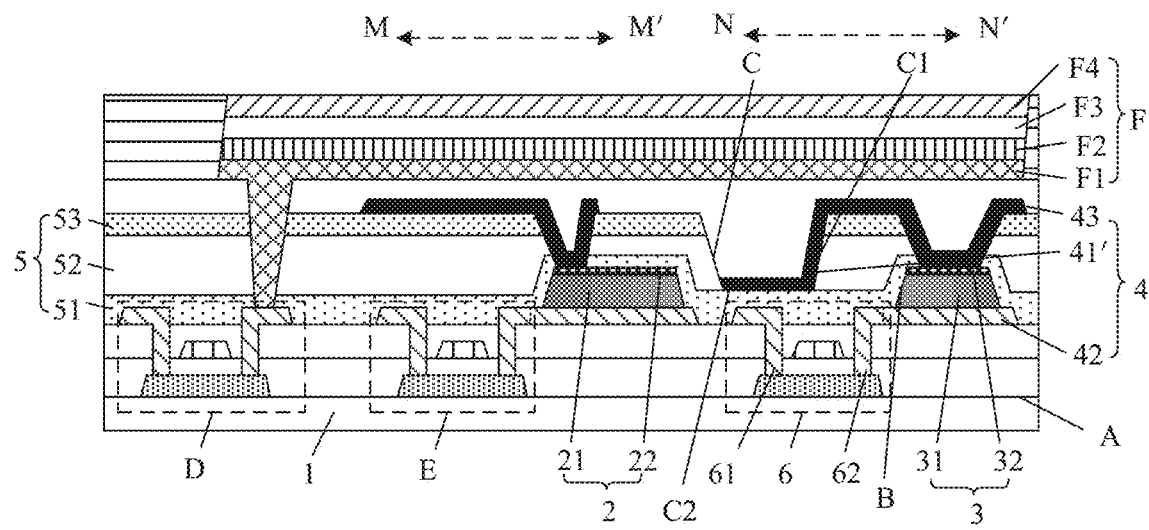
FIG. 6 is yet another sectional view taken along the M-M' direction and along the N-N' direction in FIG. 2.
Figure 7:
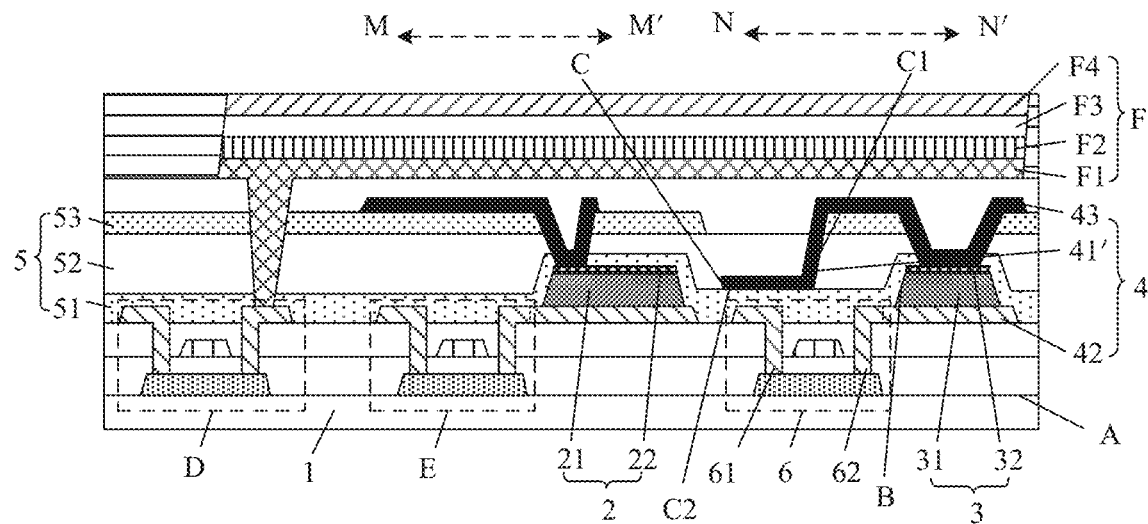
FIG. 7 is yet another sectional view taken along the M-M' direction and along the N-N' direction in FIG. 2.

In some other embodiments, as shown in FIGS. 5 to 7, the display substrate 100 further includes an insulating layer 5 disposed on the side of the temperature sensor 3 away from the base substrate 1. The insulating layer 5 is provided with a groove C around the peripheral side B of the temperature sensor 3. The light-shielding layer 4 includes a second peripheral light-shielding layer 41' disposed in the groove C. The second peripheral light-shielding layer 41' at least covers an inner sidewall C1 of the groove C proximate to the temperature sensor 3.

The insulating layer 5 has various structures, which may be selected and set according to actual needs.

In some examples, the insulating layer 5 is composed of a film. The film is, for example, a resin material layer or a passivation layer.

In some other examples, as shown in FIGS. 5 to 7, the insulating layer 5 is composed of a plurality of films that are sequentially stacked. For example, the plurality of films include the protection layer 51, the resin material layer 52, and the passivation layer 53 that are sequentially stacked. As shown in FIGS. 5 to 7, the protection layer 51 is disposed on a side of the photosensitive sensor 2 away from the base substrate 1 and the side of the temperature sensor 3 from the base substrate 1. In this way, the protection layer 51 may be used to protect the photosensitive sensor 2 and the temperature sensor 3, so as to avoid the photosensitive sensor 2 and the temperature sensor 3 from being damaged in a subsequent manufacturing process (for example, in a process of forming the resin material layer 52). By providing the resin material layer 52, the resin material layer 52 may be used for planarization, so as to prevent the photosensitive sensor 2 from being disturbed in a process of detecting the luminous intensity of the sub-pixel Q, or prevent the temperature sensor 3 from being disturbed in a process of detecting the temperature of the sub-pixel Q, thereby ensuring the accuracy of the detection result. By providing the passivation layer 53, an adhesion of a second light-shielding electrode 43 that is subsequently formed on a side surface of the passivation layer 53 away from the base substrate 1 may be enhanced, so as to prevent the second light-shielding electrode 43 from falling off. Here, a structure or a function of the second light-shielding electrode 43 may be referred to a following description of the second light-shielding electrode 43.

In some examples, FIGS. 5 and 6 are sectional views taken along the M-M' direction and the N-N' direction in FIG. 2. A sectional shape of the groove C may be selected and set according to actual needs or a process of forming the groove C. For example, the sectional shape of the groove C may be a "V" shape, or may be a "1" shape as shown in FIG. 5, or may be a "U" shape as shown in FIG. 6.

In some examples, the groove C is around the peripheral side B of the temperature sensor 3 with a certain distance from the temperature sensor 3, which may prevent the temperature sensor 3 from being damaged in the process of forming the groove C. A magnitude of the distance between the groove C and the temperature sensor 3 may be selected and set according to the formation process of the groove C or an arrangement of the temperature sensors 3.

The second peripheral light-shielding layer 41' at least covering the inner sidewall C1 of the groove C proximate to the temperature sensor 3 includes various examples. For example, in an example where the sectional shape of the groove C is the "U" shape, as shown in FIG. 6, the second peripheral light-shielding layer 41' covers the inner sidewall C1 of the groove C proximate to the temperature sensor 3, or, as shown in FIG. 6, the second peripheral light-shielding layer 41' covers the inner sidewall C1 of the groove C proximate to the temperature sensor 3, and further covers a bottom wall C2 of the groove C.

Compared to at least covering an inner sidewall of the groove C away from the temperature sensor 3, the second peripheral light-shielding layer 41' is provided to at least cover the inner sidewall C1 of the groove C proximate to the temperature sensor 3, which may reduce a distance between the second peripheral light-shielding layer 41' and the temperature sensor 3, and increase an effective light-shielding area of the second peripheral light-shielding layer 41'. Here, the effective light-shielding area refers to an area of the second peripheral light-shielding layer 41' capable of effectively shielding the light emitted to the peripheral side B of the temperature sensor 3.

In some examples, the second peripheral light-shielding layer 41' has various structures. For example, as shown in FIGS. 6 and 7, the second peripheral light-shielding layer 41' may be a light-shielding film at least covering the inner sidewall C1 of the groove C proximate to the temperature sensor 3. For example, as shown in FIG. 5, the second peripheral light-shielding layer 41' may be a loop-shaped retaining wall filled in the groove C.

In some examples, a material of the second peripheral light-shielding layer 41' is various. For example, the material of the second peripheral light-shielding layer 41' may be the light-shielding ink or the light-shielding organic material (e.g., the light-shielding resin) capable of absorbing light. For example, the material of the second peripheral light-shielding layer 41' may be a light-shielding metal material (e.g., ITO) capable of reflecting light.

In yet some other embodiments, as shown in FIGS. 4 to 7, the light-shielding layer 4 includes a first light-shielding electrode 42 disposed on the side of the temperature sensor 3 proximate to the base substrate 1. An orthographic projection of the temperature sensor 3 on the base substrate 1 is within a range of an orthographic projection of the first light-shielding electrode 42 on the base substrate 1.

In yet some other embodiments, as shown in FIGS. 4 to 7, the light-shielding layer 4 further includes the second light-shielding electrode 43 disposed on the side of the temperature sensor 3 away from the base substrate 1. The orthographic projection of the temperature sensor 3 on the base substrate 1 is within a range of an orthographic projection of the second light-shielding electrode 43 on the base substrate 1.

In some examples, the first light-shielding electrode 42 is configured to input a first electrical signal to the temperature sensor 3, and the second light-shielding electrode 43 is configured to input a second electrical signal to the temperature sensor 3. In this way, the temperature sensor 3 is able to operate under a cooperation of the first electrical signal and the second electrical signal, so as to detect the temperature of the sub-pixel Q. For example, one of the first electrical signal and the second electrical signal is a positive bias voltage signal, and another is a negative bias voltage signal.

In some embodiments of the present disclosure, the first light-shielding electrode 42 and the second light-shielding electrode 43, which are configured to input electrical signals to the temperature sensor 3, as portions of the light-shielding layer 4, shield the temperature sensor 3 from light, which may avoid additional films for light shielding, reduce the number of films, and be beneficial to reduce the thickness of the display substrate 100.

In some examples, as shown in FIGS. 4 to 7, the display substrate 100 further includes a temperature control transistor 6 disposed on the side of the temperature sensor 3 proximate to the base substrate 1. The temperature control transistor 6 includes a source 61 and a drain 62. The source 61, the drain 62, and the first light-shielding electrode 42 are arranged in a same layer, and the source 61 or the drain 62 is electrically connected to the first light-shielding electrode 42.

The temperature control transistor 6 is configured to control an output of an electrical signal converted by the temperature sensor 3. That is, when the temperature control transistor 6 is turned on, the temperature control transistor 6 inputs a control signal to the temperature sensor 3 through the first light-shielding electrode 42 electrically connected to the source 61 or the drain 62, so as to control the output of the electrical signal converted by the temperature sensor 3 through the temperature control transistor 6.

Here, the "same layer" mentioned herein means that a film for forming a specific pattern is formed by the same film forming process, and then is patterned by one patterning process using the same mask to form a layer structure. Depending on different specific patterns, the one patterning process may include several exposure, development or etching processes, the specific patterns in the formed layer structure may be continuous or discontinuous, and these specific patterns may also be at different heights or have different thicknesses. In this way, the source 61, the drain 62, and the first light-shielding electrode 42 may be manufactured synchronously, thereby simplifying the manufacturing process of the display substrate 100.

In some examples, as shown in FIGS. 4 to 7, the display substrate 100 further includes a photosensitive control transistor E disposed on a side of the photosensitive sensor 2 proximate to the base substrate 1 and electrically connected to the photosensitive sensor 2.

The photosensitive control transistor E is configured to control an output of an electric signal converted by the photosensitive sensor 2. That is, when the photosensitive control transistor E is turned on, the photosensitive control transistor E inputs a control signal to the photosensitive sensor 2, so as to control the output of the electrical signal converted by the photosensitive sensor 2 through the photosensitive control transistor E.

It will be noted that both the temperature control transistor 6 and the photosensitive control transistor E have various structures. For example, at least one of the temperature control transistor 6 and the photosensitive control transistor E may be of a top-gate transistor or a bottom-gate transistor. For example, FIGS. 2 and 3 show examples in which both the temperature control transistor 6 and the photosensitive control transistor E are bottom-gate transistors, and FIGS. 4 and 7 show examples in which both the temperature control transistor 6 and the photosensitive control transistor E are top-gate transistors.

In some examples, as shown in FIGS. 2 and 3, the display substrate 100 further includes a bias voltage signal line 7 electrically connected to at least one of the plurality of temperature sensors 3. The second light-shielding electrode 43 and the bias voltage signal line 7 are arranged in a same layer, and are electrically connected to each other.

The bias voltage signal line 7 is electrically connected to the at least one of the plurality of temperature sensors 3. That is, the bias voltage signal line 7 is electrically connected to one temperature sensor 3. Or, the bias voltage signal line 7 is electrically connected to a plurality of temperature sensors 3, for example, is electrically connected to two or three temperature sensors 3.

The display substrate 100 includes the plurality of temperature sensors 3, which means that there may be a plurality of bias voltage signal lines 7, and an arrangement of the plurality of bias voltage signal lines 7 may be determined according to an arrangement of the plurality of temperature sensors 3. For example, the plurality of temperature sensors 3 are arranged in an array, and a plurality of temperature sensors 3 in each row are commonly connected to one bias voltage signal line 7, and thus the plurality of bias voltage signal lines 7 are arranged in parallel or substantially in parallel.

The second light-shielding electrode 43 is electrically connected to the bias voltage signal line 7. In this way, a bias voltage signal (that is, the second electrical signal) of the bias voltage signal line 7 may be input to the temperature sensor 3 through the second light-shielding electrode 43, so that the temperature sensor 3 may operate under the cooperation of the bias voltage signal and the first electrical signal input through the first light-shielding electrode 42.

The second light-shielding electrode 43 and the bias voltage signal line 7 are arranged in the same layer, and in this way, the second light-shielding electrode 43 and the bias voltage signal line 7 may be manufactured synchronously by using one patterning process, which is beneficial to simplify the manufacturing process of the display substrate 100.

In some examples, as shown in FIGS. 6 and 7, in a case where the light-shielding layer 4 includes the second peripheral light-shielding layer 41', and the material of the second peripheral light-shielding layer 41' includes the light-shielding metal material, the second peripheral light-shielding layer 41' and the second light-shielding electrode 43 are arranged in a same layer. In this way, the second peripheral light-shielding layer 41' and the second light-shielding electrode 43 may be manufactured synchronously by using one patterning process, which is beneficial to simplify the manufacturing process of the display substrate 100.

After the photosensitive sensor 2 and the temperature sensor 3 in the embodiments of the present disclosure perform respective detections, the detection results also need to be output. The photosensitive sensor 2 and the temperature sensor 3 have various output modes of the detection results, which may be selected and set according to actual needs.

In some embodiments, as shown in FIG. 3, the display substrate 100 further includes a first signal line 8 electrically connected to the photosensitive sensor 2 and a second signal line 9 electrically connected to the temperature sensor 3.

In some examples, each photosensitive sensor 2 is electrically connected to one first signal line 8, and the first signal line 8 is configured to output the detection result of the corresponding photosensitive sensor 2. Each temperature sensor 3 is electrically connected to one second signal line 9, and the second signal line 9 is configured to output the detection result of the corresponding temperature sensor 3.

The photosensitive sensor 2 and the temperature sensor 3 are connected to signal lines, respectively, so that the output of the detection result of the photosensitive sensor 2 and the output of the detection result of the temperature sensor 3 may be performed synchronously. Moreover, it is possible to avoid a phenomenon of crosstalk of the detection results when the results are output, which is beneficial to improve the accuracy of the output result, and is further beneficial to shorten duration for optically compensating each sub-pixel Q.

In some other embodiments, as shown in FIG. 2, the display substrate 100 further includes a first signal line 8 electrically connected to the photosensitive sensor 2. The temperature sensor 3 is electrically connected to the first signal line 8 that is electrically connected to any photosensitive sensor 2 located in the same pixel area P. That is, the temperature sensor 3 and any photosensitive sensor 2 located in the same pixel area P share one first signal line 8.

In this case, the first signal line 8 shared by the temperature sensor 3 and any photosensitive sensor 2 located in the same pixel area P, may output the detection result of the photosensitive sensor 2 and the detection result of the temperature sensor 3 in different periods. This is beneficial to reduce the number of signal lines used to output the detection results, and is beneficial to reduce an occupancy rate of signal lines.

Figure 13:
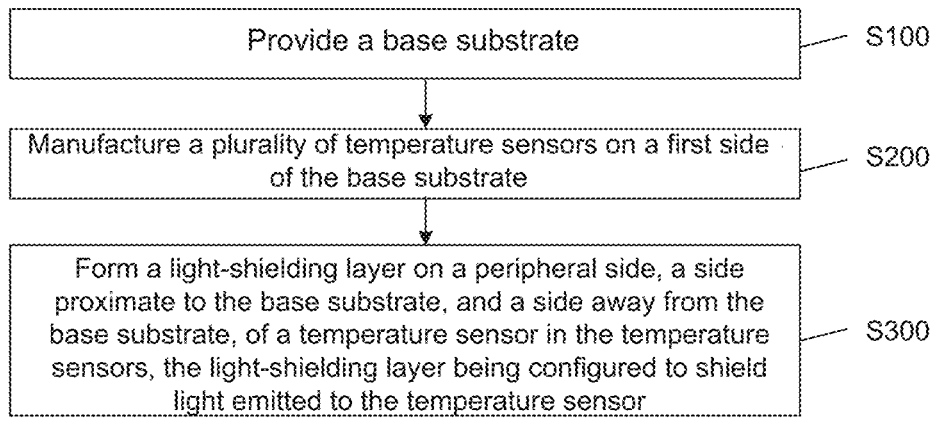
FIG. 13 is a flow chart of a method of manufacturing a display substrate, in accordance with some embodiments of the present disclosure.

In some embodiments of the present disclosure, a method of manufacturing a display substrate is provided. As shown in FIG. 13, the method of manufacturing the display substrate includes S100 to S300.

Figure 17:
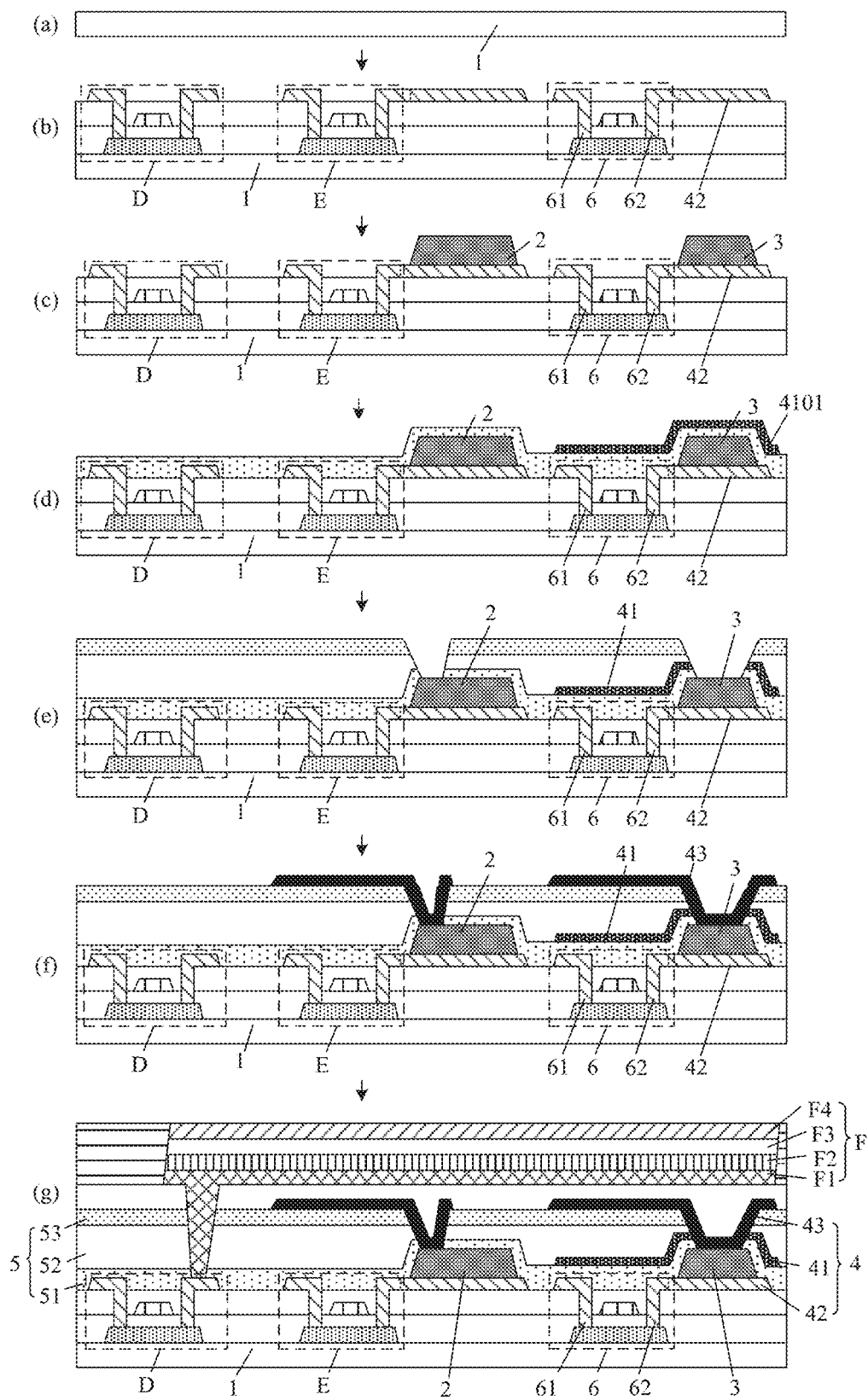
FIG. 17 is a flow chart of manufacturing a display substrate, in accordance with some embodiments of the present disclosure.

In S100, as shown in FIG. 17(*a*), provide a base substrate 1.

There are various types of base substrate, which may be selected and set according to actual needs. The type of the base substrate 1 may be referred to the types mentioned in some of the above embodiments.

Figure 18:
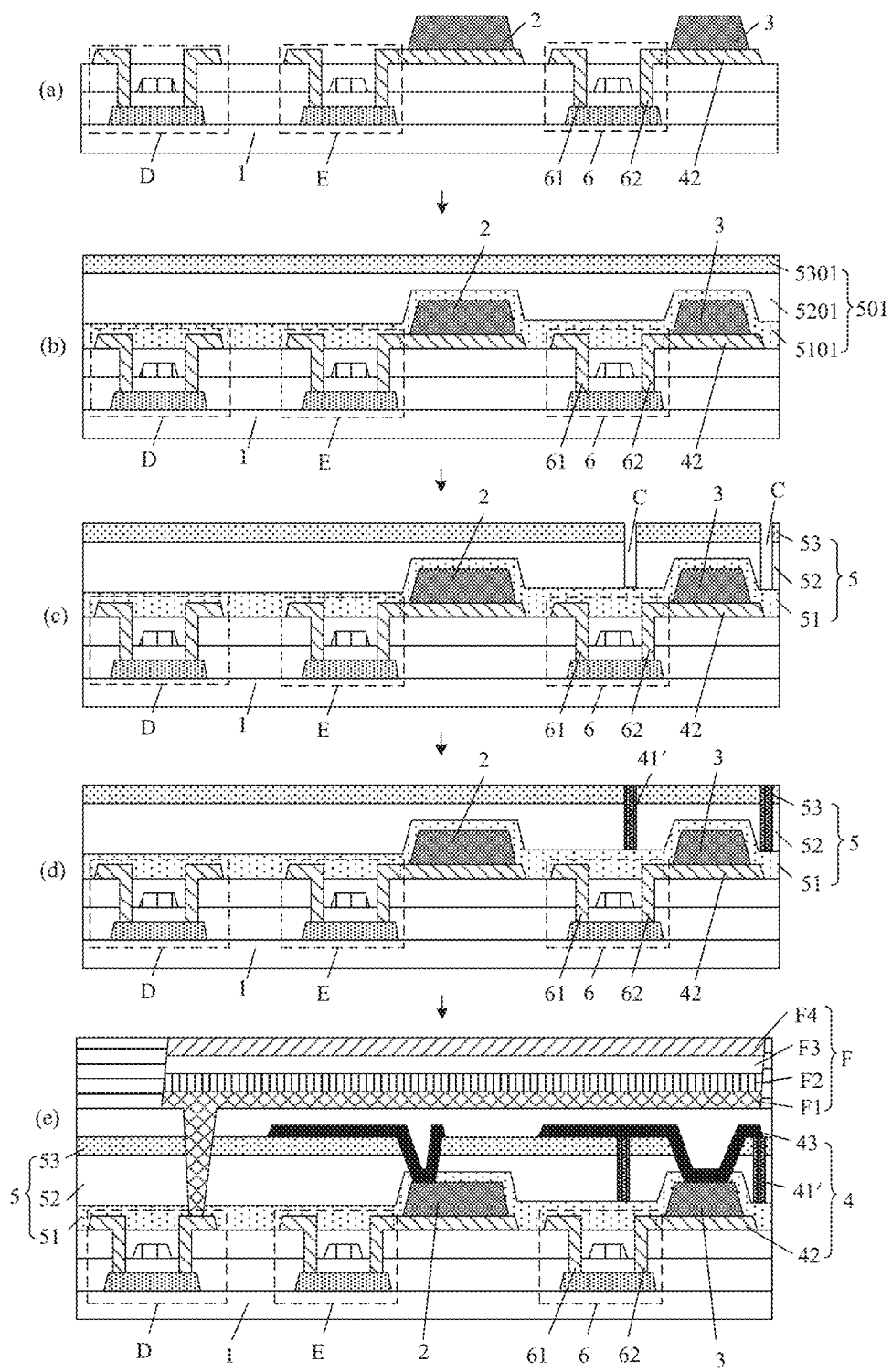
FIG. 18 is a flow chart of manufacturing another display substrate, in accordance with some embodiments of the present disclosure.
Figure 19:
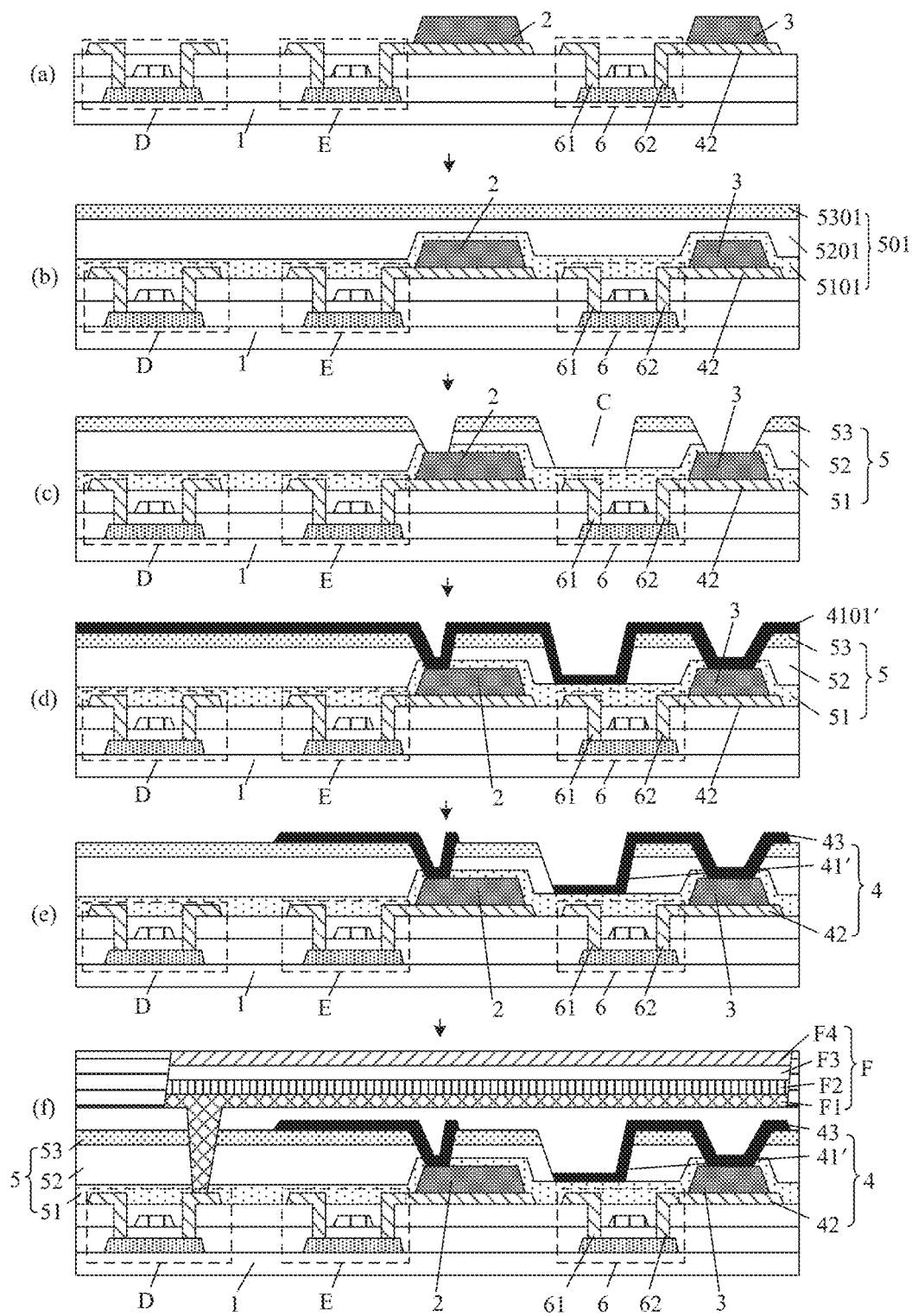
FIG. 19 is a flow chart of manufacturing yet another display substrate, in accordance with some embodiments of the present disclosure.

In S200, as shown in FIG. 17(*c*), FIG. 18(*a*), and FIG. 19(*a*), manufacture a plurality of temperature sensors 3 on a side of the base substrate 1.

In some examples, the temperature sensor 3 has various structures. For example, as shown in FIGS. 4 to 7, the temperature sensor 3 includes a second semiconductor layer 31 and a second protection electrode 32 covering a side surface of the second semiconductor layer 31.

In this case, for example, manufacturing the plurality of temperature sensors 3 on the side of the base substrate 1, includes: forming a semiconductor film on a first side A of the base substrate 1, and patterning (for example, etching) the semiconductor film to form the second semiconductor layer 31; depositing a first metal film on a side of the second semiconductor layer 31 away from the base substrate 1, and etching the first metal film by using a photolithography process to form the second protection electrode 32.

In some examples, in S200, in the process of manufacturing the plurality of temperature sensors 3, a plurality of photosensitive sensors 2 are also manufactured synchronously.

The photosensitive sensor 2 may have various structures. For example, the photosensitive sensor 2 has a similar structure to the temperature sensor 3. That is, the photosensitive sensor 2 includes a first semiconductor layer 21 and a first protection electrode 22 covering a side surface of the first semiconductor layer 21. In this case, while patterning the semiconductor film to form the second semiconductor layer 31, the first semiconductor layer 21 may be formed, and while etching the first metal film to form the second protection electrode 32, the first protection electrode 22 may be formed.

In some examples, as shown in FIG. 17(*b*), before S200, driving transistors D, photosensitive control transistors E, and temperature control transistors 6 are also formed on the side of the base substrate 1.

In S300, form a light-shielding layer 4 on a peripheral side B, a side proximate to the base substrate 1, and a side away from the base substrate 1, of the temperature sensor 3. The light-shielding layer 4 is configured to shield light emitted to the temperature sensor 3.

Beneficial effects that may be achieved by the method of manufacturing the display substrate in the embodiments of the present disclosure are the same as beneficial effects that may be achieved by the display substrate 100 in some of the above embodiments, which will not be repeated here.

It will be noted that the reference numerals (e.g., S100, S200, and S300) of the steps of manufacturing the display substrate in the embodiments of the present disclosure are only used for clearly indicating the contents of the steps, but are not limitations on the sequence of the steps.

In some embodiments, in S300, a method of forming the light-shielding layer 4 is related to a structure of the light-shielding layer 4.

In some examples, the light-shielding layer 4 includes a first light-shielding electrode 42 disposed on a side of the temperature sensor 3 proximate to the base substrate 1, a second light-shielding electrode 43 disposed on a side of the temperature sensor 3 away from the base substrate 1, and a peripheral light-shielding layer (i.e., a first peripheral light-shielding layer 41 or a second peripheral light-shielding layer 41') disposed on a peripheral side B of the temperature sensor 3.

Thus, as shown in FIG. 17(*b*), in S300, forming the first light-shielding electrode 42, for example, includes: before S200, forming a second metal film by a deposition process or a sputtering process on the first side A of the base substrate 1, and etching the second metal film by a photolithography process to form the first light-shielding electrode 42. As shown in FIG. 17(*f*), FIG. 18(*e*), and FIG. 19(*e*), in S300, forming the second light-shielding electrode 43, for example, includes: after S200, forming a third metal film by a deposition process or a sputtering process on the side of the temperature sensor 3 away from the base substrate 1, and etching the third metal film by a photolithography process to form the second light-shielding electrode 43.

Since the peripheral light-shielding layer included in the light-shielding layer 4 has various structures, manufacturing methods corresponding to respective structures have differences therebetween. Below, the manufacturing method of the peripheral light-shielding layer will be schematically described in examples where the light-shielding layer 4 includes the first peripheral light-shielding layer 41 and the light-shielding layer 4 includes the second peripheral light-shielding layer 41'.

Figure 14:
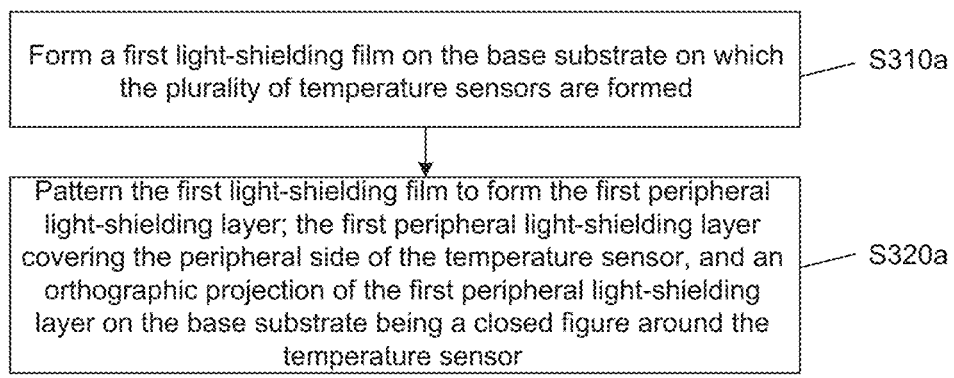
FIG. 14 is a flow chart of forming a first peripheral light-shielding layer on a peripheral side of a temperature sensor, in accordance with some embodiments of the present disclosure.

In some embodiments, in S300, as shown in FIG. 14, in a case where the light-shielding layer 4 includes the first peripheral light-shielding layer 41, forming the first peripheral light-shielding layer 41 on the peripheral side B of the temperature sensor 3, includes S310*a* and S320*a*.

In S310*a*, as shown in FIG. 17(*d*), form a first light-shielding film 4101 on the base substrate 1 on which the plurality of temperature sensors 3 are formed.

Here, for example, a coating process (e.g., a spin-coating process or a spraying process) may be used to form the first light-shielding film 4101.

In some examples, a material of the first light-shielding film 4101 is various. For example, the material of the first light-shielding film 4101 may be a light-shielding ink or a light-shielding organic material. Here, the light-shielding organic material includes a light-shielding resin.

In S320*a*, as shown in FIG. 17(*e*), pattern the first light-shielding film 4101 to form the first peripheral light-shielding layer 41. The first peripheral light-shielding layer 41 covers the peripheral side B of the temperature sensor 3, and an orthographic projection of the first peripheral light-shielding layer 41 on the base substrate 1 is a closed figure around the temperature sensor 3.

Here, a process of patterning the first light-shielding film 4101 may be, for example, a photolithography process.

Figure 15:
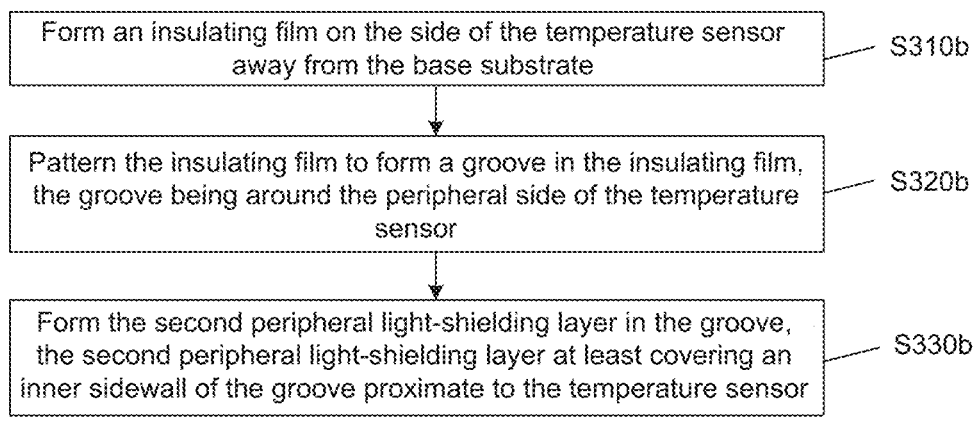
FIG. 15 is a flow chart of forming a second peripheral light-shielding layer on a peripheral side of a temperature sensor, in accordance with some embodiments of the present disclosure.

In some other embodiments, in S300, as shown in FIG. 15, in a case where the light-shielding layer 4 includes the second peripheral light-shielding layer 41', forming the second peripheral light-shielding layer 41' on the peripheral side B of the temperature sensor 3, includes S310*b* to S330*b*.

In S310*b*, as shown in FIG. 18(*b*) and FIG. 19(*b*), form an insulating film 501 on the side of the temperature sensor 3 away from the base substrate 1.

In some examples, the insulating film 501 is of a structure composed of at least one layer of film. For example, the insulating film 501 includes a protection film 5101, a resin material film 5201, and a passivation film 5301 that are sequentially stacked.

Here, a coating process (e.g., a spin-coating process or a spraying process) may be used to form the protection film 5101, the resin material film 5201, and the passivation film 5301 sequentially.

In S320*b*, as shown in FIG. 18(*c*) and FIG. 19(*c*), pattern the insulating film 501, and form a groove C in the insulating film 501. The groove C is around the peripheral side B of the temperature sensor 3.

Here, after the groove C is formed in the insulating film 501, an insulating layer 5 is obtained. In a case where the insulating film 501 includes the protection film 5101, the resin material film 5201, and the passivation film 5301, the insulating layer 5 includes a protection layer 51, a resin material layer 52, and a passivation layer 53.

There are various processes for forming the groove C. For example, the groove C is formed by using a photolithography process.

In some examples, a depth of the groove C (i.e., a dimension in a direction perpendicular to the base substrate 1) may be selected and set according to actual needs. For example, the groove C may only penetrate the passivation layer 53. That is, the depth of the groove C is the same as a thickness (i.e., a dimension in the direction perpendicular to the base substrate 1) of the passivation layer 53. For example, as shown in FIG. 18(*c*) and FIG. 19(*c*), the groove C penetrates the passivation layer 53 and the resin material layer 52. That is, the depth of the groove C is a sum of the thickness of the passivation layer 53 and a thickness (i.e., a dimension in the direction perpendicular to the base substrate 1) of the resin material layer 52.

In S330*b*, as shown in FIG. 18(*d*) and FIG. 19(*e*), form the second peripheral light-shielding layer 41' in the groove C. The second peripheral light-shielding layer 41' at least covers an inner sidewall C1 of the groove C proximate to the temperature sensor 3.

Here, a material of the second peripheral light-shielding layer 41' is various. For example, the material of the second peripheral light-shielding layer 41' includes a light-shielding ink, a light-shielding organic material, or a light-shielding metal material. A process of forming the second peripheral light-shielding layer 41' in the groove C is related to the type of the material thereof.

Figure 16:
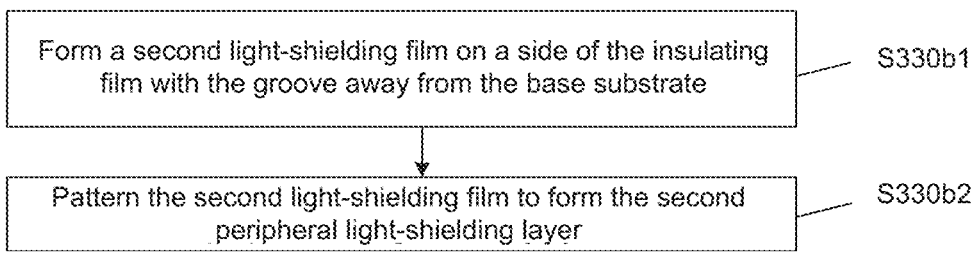
FIG. 16 is a flow chart of forming a second peripheral light-shielding layer in a groove, in accordance with some embodiments of the present disclosure.

In some examples, as shown in FIG. 16, in a case where the material of the second peripheral light-shielding layer 41' includes the light-shielding metal material, in S330*b*, forming the second peripheral light-shielding layer 41' in the groove C, includes S330*b*1 and S330*b*2.

In S330*b*1, as shown in FIG. 19(*d*), form a second light-shielding film 4101' on a side of the insulating film 501 with the groove C away from the base substrate 1.

When forming the second light-shielding film 4101', a deposition process or a sputtering process may be used.

In a case where the material used for the second peripheral light-shielding layer 41' is the same as the material used for the second light-shielding electrode 43, the second light-shielding film 4101' formed here is the third metal film.

In S330*b*2, as shown in FIG. 19(*e*), pattern the second light-shielding film 4101' to form the second peripheral light-shielding layer 41'.

Here, a photolithography process may be used to pattern the second light-shielding film 4101'.

In the case where the material used for the second peripheral light-shielding layer 41' is the same as the material used for the second light-shielding electrode 43, after the patterning, the second peripheral light-shielding layer 41' and the second light-shielding electrode layer 43 may be formed synchronously.

In some examples, as shown in FIG. 17(*d*), in a case where the material of the second peripheral light-shielding layer 41' includes the light-shielding ink or the light-shielding organic material, in S330*b*, forming the second peripheral light-shielding layer 41' in the groove C, includes: filling the material of the second peripheral light-shielding layer 41' in the groove by using a printing process to form a loop-shaped retaining wall in the groove C.

Of course, the process of forming the second peripheral light-shielding layer 41' in the groove C is not limited to the printing process. For example, forming the second peripheral light-shielding layer 41' in the groove C may further include: coating the material of the second side light-shielding layer 41' on the side of the insulating film 501 with the groove C away from the base substrate 1, and etching by using a photolithography process, so as to form the second peripheral light-shielding layer 41'.

In some examples, as shown in FIG. 17(*g*), FIG. 18(*e*), and FIG. 19(*f*), after the light-shielding layer 4 is formed, the method of manufacturing the display substrate further includes: forming a light-emitting device F on a side of the light-shielding layer 4 away from the base substrate 1.

In addition, in some examples, as shown in FIG. 17(*g*), FIG. 18(*e*), and FIG. 19(*f*), before forming the light-emitting device F on the side of the light-shielding layer 4 away from the base substrate 1, an adhesive (e.g., OCV optical adhesive) is further formed on the side of the light-shielding layer 4 away from the base substrate 1. In this way, the adhesive may be used to enhance an adhesion between the light-emitting device F and the light-shielding layer 4.

It will be noted that in a case where the material of the second peripheral light-shielding layer 41' in the light-shielding layer 4 includes the light-shielding metal material, the groove C may not be completely filled with the material of the second peripheral light-shielding layer 41'. In this case, as shown in FIG. 19(*f*), the adhesive may be directly formed on the side of the light-shielding layer 4 away from the base substrate 1, and the groove C may be filled with the adhesive. Or, as shown in FIG. 7, the groove C may be firstly filled with the material for forming the resin material layer 52, and then the adhesive is formed on the side of the light-shielding layer 4 away from the base substrate 1, which is not limited in the embodiments of the disclosure does.

Figure 20:
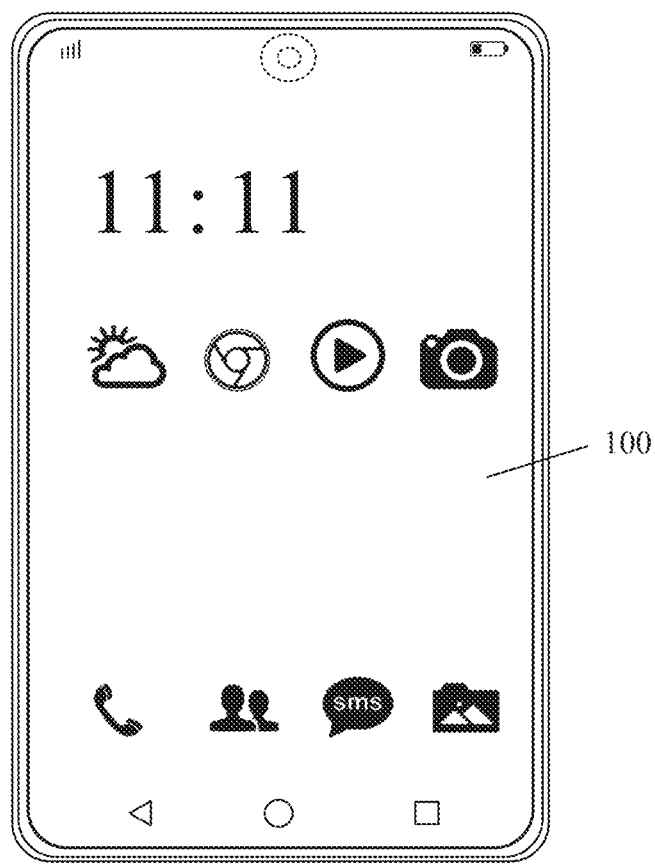
FIG. 20 is a structural diagram of a display device, in accordance with some embodiments of the present disclosure.

In some embodiments of the present disclosure, a display device 200 is provided. As shown in FIG. 20, the display device 200 includes the display substrate 100 in some of the above embodiments. The display substrate 100 in the display device 200 has the same technical effects as the display substrate 100 in some of the above embodiments, which will not be repeated here.

In some embodiments, the light-emitting device F in the display substrate 100 is an OLED, and the display device 200 is an OLED display device. In this case, the display device 200 may further include a structure for realizing other functions, such as an encapsulation cover plate for encapsulating the display substrate 100.

In some embodiments, the display device 200 is a product or a component with a display function such as a mobile phone, a tablet computer, a notebook computer, a display, a television, a digital photo frame, or a navigator.

The foregoing descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising a plurality of sub-pixels; the display substrate further comprising:
a base substrate;
a plurality of temperature sensors disposed on a first side of the base substrate, a temperature sensor in the temperature sensors being configured to detect a temperature of at least one of the plurality of sub-pixels; and
a light-shielding layer disposed on a peripheral side, a side proximate to the base substrate, and a side away from the base substrate, of the temperature sensor, the light-shielding layer being configured to shield light emitted to the temperature sensor.

2. The display substrate according to claim 1, wherein the light-shielding layer includes a first peripheral light-shielding layer covering the peripheral side of the temperature sensor;
an orthographic projection of the first peripheral light-shielding layer on the base substrate is a closed figure around the temperature sensor.

3. The display substrate according to claim 2, wherein an inner edge of the first peripheral light-shielding layer extends to the side of the temperature sensor away from the base substrate, and an outer edge of the first peripheral light-shielding layer extends to a peripheral area of the temperature sensor.

4. The display substrate according to claim 2, wherein a material of the first peripheral light-shielding layer includes a light-shielding ink or a light-shielding organic material.

5. The display substrate according to claim 1, further comprising an insulating layer disposed on the side of the temperature sensor away from the base substrate, a groove around the peripheral side of the temperature sensor being provided in the insulating layer;
the light-shielding layer including a second peripheral light-shielding layer disposed in the groove;
the second peripheral light-shielding layer at least covering an inner sidewall of the groove proximate to the temperature sensor.

6. The display substrate according to claim 5, wherein the second peripheral light-shielding layer is a light-shielding film at least covering the inner sidewall of the groove proximate to the temperature sensor, or a loop-shaped retaining wall filled in the groove.

7. The display substrate according to claim 5, wherein a material of the second peripheral light-shielding layer includes a light-shielding ink, a light-shielding organic material, or a light-shielding metal material.

8. The display substrate according to claim 1, wherein the light-shielding layer includes a first light-shielding electrode disposed on the side of the temperature sensor proximate to the base substrate;
an orthographic projection of the temperature sensor on the base substrate is within a range of an orthographic projection of the first light-shielding electrode on the base substrate.

9. The display substrate according to claim 8, further comprising a temperature control transistor disposed on the side of the temperature sensor proximate to the base substrate;
the temperature control transistor including a source and a drain, the source, the drain, and the first light-shielding electrode being arranged in a same layer, and the source or the drain being electrically connected to the first light-shielding electrode.

10. The display substrate according to claim 1, wherein the light-shielding layer includes a second light-shielding electrode disposed on the side of the temperature sensor away from the base substrate;
an orthographic projection of the temperature sensor on the base substrate is within a range of an orthographic projection of the second light-shielding electrode on the base substrate.

11. The display substrate according to claim 10, further comprising a bias voltage signal line electrically connected to at least one of the plurality of temperature sensors;
the second light-shielding electrode and the bias voltage signal line being arranged in a same layer, and being electrically connected to each other.

12. The display substrate according to claim 10, further comprising an insulating layer disposed on the side of the temperature sensor away from the base substrate, a groove around the peripheral side of the temperature sensor being provided in the insulating layer; wherein
the light-shielding layer includes a second peripheral light-shielding layer disposed in the groove, the second peripheral light-shielding layer at least covers an inner sidewall of the groove proximate to the temperature sensor, a material of the second peripheral light-shielding layer includes a light-shielding metal material, and the second peripheral light-shielding layer and the second light-shielding electrode are arranged in a same layer.

13. The display substrate according to claim 1, wherein the display substrate has a plurality of pixel areas, and at least one of the plurality of sub-pixels is disposed in a pixel area in the pixel areas;
the display substrate further comprises a plurality of photosensitive sensors disposed on the first side of the base substrate;
at least one of the plurality of photosensitive sensors is disposed in the pixel area;

the at least one photosensitive sensor is configured to detect at least one luminous intensity of the at least one sub-pixel in the pixel area where the at least one photosensitive sensor is located.

14. The display substrate according to claim 13, further comprising a first signal line electrically connected to the photosensitive sensor, and a second signal line electrically connected to the temperature sensor; or, the display substrate further comprising the first signal line electrically connected to the photosensitive sensor, the temperature sensor being electrically connected to the first signal line that is electrically connected to any photosensitive sensor located in a same pixel area.

15. A method of manufacturing a display substrate, comprising:

providing a base substrate;

manufacturing a plurality of temperature sensors on a first side of the base substrate;

forming a light-shielding layer on a peripheral side, a side proximate to the base substrate, and a side away from the base substrate, of a temperature sensor in the temperature sensors, the light-shielding layer being configured to shield light emitted to the temperature sensor.

16. The method according to claim 15, wherein the light-shielding layer includes a first peripheral light-shielding layer; forming the first peripheral light-shielding layer on the peripheral side of the temperature sensor, includes:

forming a first light-shielding film on the base substrate on which the plurality of temperature sensors are formed;

patterning the first light-shielding film to form the first peripheral light-shielding layer; the first peripheral light-shielding layer covering the peripheral side of the temperature sensor, and an orthographic projection of the first peripheral light-shielding layer on the base substrate being a closed figure around the temperature sensor.

17. The method according to claim 15, wherein the light-shielding layer includes a second peripheral light-shielding layer; forming the second peripheral light-shielding layer on the peripheral side of the temperature sensor, includes:

forming an insulating film on the side of the temperature sensor away from the base substrate;

patterning the insulating film to form a groove in the insulating film, the groove being around the peripheral side of the temperature sensor;

forming the second peripheral light-shielding layer in the groove, the second peripheral light-shielding layer at least covering an inner sidewall of the groove proximate to the temperature sensor.

18. The method according to claim 17, wherein forming the second peripheral light-shielding layer in the groove, includes:

forming a second light-shielding film on a side of the insulating film with the groove away from the base substrate;

patterning the second light-shielding film to form the second peripheral light-shielding layer.

19. The method according to claim 17, wherein forming the second peripheral light-shielding layer in the groove, includes:

filling a material of the second peripheral light-shielding layer in the groove by using a printing process to form a loop-shaped retaining wall in the groove.

20. A display device, comprising the display substrate according to claim 1.

* * * * *